(12) United States Patent
Brueck et al.

(10) Patent No.: US 11,327,012 B2
(45) Date of Patent: May 10, 2022

(54) METHOD AND SYSTEM FOR IN-LINE OPTICAL SCATTEROMETRY

(71) Applicant: UNM RAINFOREST INNOVATIONS, Albuquerque, NM (US)

(72) Inventors: Steven R. J. Brueck, Albuquerque, NM (US); Juan Jose Faria Briceno, Albuquerque, NM (US); Ruichao Zhu, Albuquerque, NM (US)

( * ) Notice: Subject to any disclaimer, the term of this patent is extended or adjusted under 35 U.S.C. 154(b) by 0 days.

(21) Appl. No.: 17/053,585

(22) PCT Filed: May 6, 2019

(86) PCT No.: PCT/US2019/030943
§ 371 (c)(1),
(2) Date: Nov. 6, 2020

(87) PCT Pub. No.: WO2019/217330
PCT Pub. Date: Nov. 14, 2019

(65) Prior Publication Data
US 2021/0239612 A1    Aug. 5, 2021

Related U.S. Application Data

(60) Provisional application No. 62/668,003, filed on May 7, 2018, provisional application No. 62/776,640, filed on Dec. 7, 2018.

(51) Int. Cl.
*G01N 21/47* (2006.01)
*G01B 11/02* (2006.01)
*G03F 7/20* (2006.01)

(52) U.S. Cl.
CPC .............. *G01N 21/47* (2013.01); *G01B 11/02* (2013.01); *G03F 7/70616* (2013.01);
(Continued)

(58) Field of Classification Search
CPC ........... G01N 21/47; G01N 2021/4723; G01N 2201/06113; G01N 2201/0636;
(Continued)

(56) References Cited

U.S. PATENT DOCUMENTS 5,859,424 A * 1/1999 Norton .................... G02B 27/58
250/226
6,392,749 B1   5/2002 Meeks et al.
(Continued)

FOREIGN PATENT DOCUMENTS

| JP | 3631056 B2 | 3/2005 | |
| WO | 2016015734 A1 | 2/2016 | |
| WO | WO-2021087345 A1 * | 5/2021 | ......... G01B 11/0641 |

OTHER PUBLICATIONS

Search Report and Written Opinion dated Aug. 22, 2019 in corresponding PCT Application No. PCT/US2019/030943, 6 pages.
(Continued)

*Primary Examiner* — Gordon J Stock, Jr.
(74) *Attorney, Agent, or Firm* — MH2 Technology Law Group LLP

(57) ABSTRACT

A system for measuring a periodic array of structures on a sample is provided. The system includes an optical source configured to produce an optical beam; an optical system configured to control the polarization of the optical beam and to focus the optical beam with a first $NA_1$ on a sample surface and to sweep the angle of incidence across a range of angles with an approximately fixed focal position on a sample surface with a second $NA_2$ wherein $NA_2 > NA_1$; additional optical components configured to receive the optical beam reflected from the sample surface and to focus the reflected beam onto a detector; and a recording system to record the reflectivity of the sample surface as a function of the angle of incidence.

18 Claims, 6 Drawing Sheets

(52) U.S. Cl.
CPC ...... *G03F 7/70625* (2013.01); *G01B 2210/56* (2013.01); *G01N 2021/4723* (2013.01); *G01N 2201/0636* (2013.01); *G01N 2201/06113* (2013.01)

(58) Field of Classification Search
CPC .... G01B 2210/56; G01B 11/02; G01B 11/14; G03F 7/70616; G03F 7/70625; G03F 7/70633
See application file for complete search history.

(56) References Cited

U.S. PATENT DOCUMENTS

| | | | | |
|---|---|---|---|---|
| 6,429,943 | B1 * | 8/2002 | Opsal | G01B 11/02 356/625 |
| 6,724,475 | B2 * | 4/2004 | Benesch | G01N 21/4788 356/237.4 |
| 6,888,627 | B2 * | 5/2005 | Leslie | G01N 21/94 356/237.2 |
| 7,292,341 | B2 | 11/2007 | Brill et al. | |
| 8,294,887 | B1 * | 10/2012 | Biellak | G01N 21/9501 356/237.1 |
| 10,302,560 | B2 * | 5/2019 | Pruneri | G01N 21/57 |
| 10,816,482 | B2 * | 10/2020 | Sreenivasan | G01N 21/95623 |
| 10,935,893 | B2 * | 3/2021 | Pandev | H01L 22/12 |
| 11,073,768 | B2 * | 7/2021 | Hill | G03F 7/70625 |
| 2002/0030813 | A1 * | 3/2002 | Norton | G02B 17/0852 356/327 |
| 2002/0051564 | A1 * | 5/2002 | Benesch | G03F 7/70491 382/145 |
| 2013/0321810 | A1 * | 12/2013 | Wang | G01N 21/211 356/369 |
| 2014/0375981 | A1 * | 12/2014 | Wang | G01N 21/956 356/51 |
| 2018/0052099 | A1 * | 2/2018 | Hill | G01J 3/12 |
| 2018/0238814 | A1 * | 8/2018 | Sapiens | H01L 22/12 |

OTHER PUBLICATIONS

International Preliminary Report on Patentability dated Nov. 10, 2020 in corresponding PCT Application No. PCT/US2019/030943, 5 pages.

* cited by examiner

METHOD AND SYSTEM FOR IN-LINE OPTICAL SCATTEROMETRY

CROSS-REFERENCE TO RELATED APPLICATIONS

This application is a 371 National Phase application based on International Application PCT/US2019/030943 filed May 6, 2019, and it claims priority to U.S. provisional patent application No. 62/668,003 filed on May 7, 2018 and U.S. provisional patent application No. 62/776,640 filed on Dec. 7, 2018, which are both hereby incorporated by reference in their entireties.

GOVERNMENT FUNDING

This invention was made with government support provided by the National Science Foundation under grant no. EEC1160494. The Government has certain rights in the invention.

BACKGROUND

Metrology is essential to any manufacturing process. The challenges for metrology are increasing as the scale of manufacturing is decreased to micrometer and even nanometer linear dimensions in many product areas such as electronics and photonics. Metrology can be off-line (in a separate tool), at-line (in a tool associated with the manufacturing process), or in-line (in a tool that monitors the manufacturing process at speeds comparable to the manufacturing operation and without disruption of the manufacturing flow). The requirements for speed of the metrology increase as the metrology unit process is brought closer to the manufacturing line. For an in-line tool, the measurement speed has to be commensurate with the speed of the processing tool, for example, web speed for a roll-to-roll machine. As well as speed, the requirements for an in-line metrology include: resolution commensurate with the manufacturing scale; areal coverage sufficient to provide information relevant to manufacturing yield; nondestructive operation, and ideally noncontact, so as not to impact the yield.

Current semiconductor devices are fabricated at a linear scale of 10 nm or below and employ structures such as 3D ridges (FINFET architecture) with complex 3D topologies. Due to the increased complexity of semiconductor devices and processing, increasing numbers of metrology steps are required for monitoring and quality control; which translate to expensive and time-consuming processes during fabrication.

Two techniques that are often used for dimensional metrology in the semiconductor industry are scanning electron microscopes (SEM) and atomic-force microscopes (AFM). SEM requires a high vacuum environment which limits its applicability for in-line applications and top-down SEM measurements cannot provide information on the 3D structure. Cross-section SEM can provide this information; however destructive sectioning of the substrate is required. Additionally, each sample only examines a few structures and it is difficult to sample multiple regions of a large wafer. AFM can be applied to a full wafer, but usually only covering small sampled areas, however, there are significant difficulties involved with deconvolution of the tip topology from the measured lineshape as well as issues related to the robustness of the tip and the speed of measurement.

Scatterometry, the measurement of light reflected/transmitted/scattered from a sample has a long history of providing metrological information. Scatterometry is a noncontact, nondestructive far-field optical technique that satisfies most of the metrology requirements. Sensitivity to nanoscale feature dimensions has been demonstrated. Two directions in scatterometry have been investigated: 1) ellipsometric scatterometry where the complex polarization response (Mueller matrix) is measured as a function of wavelength of the incident light using a broadband incoherent source; and 2) angular scatterometry where the angle of incidence is varied at a fixed wavelength using a laser source. Each has advantages: ellipsometric scatterometry has greater sensitivity, but a) requires a more detailed knowledge and control of the properties of all of the involved materials as a function of wavelength and b) requires a long measurement time because of restrictions on optical power density imposed by an extended, incoherent source. Angular scatterometry has a potential for a faster response since it uses a much brighter [power/(wavelength-cm$^2$-solid-angle)] coherent laser source that can be focused to small dimensions as needed by metrology targets and offers much higher power densities, allowing larger bandwidth receivers to accommodate higher speeds. Additionally, angular scatterometry only requires knowledge of the optical properties at a single wavelength, usually well removed from spectral regions of high material variability, which makes the interpretation of the scattering signature vs. angle more reliable.

2θ scatterometry, a noncontact optical measurement of the reflectivity of a structured pattern on a wafer, has demonstrated the necessary resolution for 3D structures. However most designs operate as off-line tools with measurement times that are incompatible with manufacturing process control needs.

The silicon industry is dominated by wafer-scale processing where stand-alone metrology tools are commonly used, and metrology measurements are not necessarily correlated with the manufacturing cycle. Increasingly, there is intense interest in migrating micrometer and sub-micrometer scale manufacturing to roll-to-roll (R2R) processes that offer significant throughput advantages. For R2R manufacturing, it is necessary to include metrology that can operate at speed commensurate with the manufacturing process. This requires a measurement speed such that the R2R web is effectively stationary during the measurement.

Additionally, many implementations of 2θ scatterometry involve synchronous mechanical rotation of both the sample and a detector in order to track the reflectivity as a function of angle. This is incompatible with R2R processes where the sample (web) is continuously moving in one direction and cannot be manipulated for the measurement.

Thus, a heretofore unaddressed need exists in the industry to address the aforementioned deficiencies and inadequacies.

SUMMARY

According to examples of the present disclosure, a system for measuring a periodic array of structures on a sample is provided. The system comprises an optical source configured to produce an optical beam; an optical system configured to control the polarization of the optical beam and to focus the optical beam with a first $NA_1$ on a sample surface and to sweep the angle of incidence across a range of angles with an approximately fixed focal position on a sample surface with a second $NA_2$ wherein $NA_2 > NA_1$; additional optical components configured to receive the optical beam reflected from the sample surface and to focus the reflected beam onto a detector; and a recording system to record the reflectivity of the sample surface as a function of the angle of incidence.

In some examples, the optical source comprises a laser. In some examples, the optical system comprise a movable mirror configured to sweep the optical beam across a range of angles of incidence at a frequency of about 2 kHz; a lens configured to collimate an expanding optical beam reflected from the movable mirror, and optical components configured to focus the optical beam that is collimated onto the sample surface at a variable angle of incidence. In some examples, the optical components comprise a parabolic mirror. In some examples, at least one 2θ scatterometry apparatus is integrated into a roll-to-roll manufacturing tool. In some examples, the output of the 2θ scatterometry measurement is used to provide a metrology module for assessing the performance of the manufacturing tool.

According to examples of the present disclosure, a method for 2θ scatterometry is provided. The method can comprise collimating and polarizing, using optical components, an optical beam from a laser light source to produce a collimated and polarized optical beam; projecting, using additional optical components, a focal spot of the collimated and polarized optical beam onto a first surface of a sample with a dynamically variable angle of incidence; collecting, by a third optical system, light reflected from the sample at an optical detector; recording a signal from the optical detector giving the reflectivity vs. angle of incidence of the sample; and interpreting the recorded angular spectrum to monitor the status of the sample.

In some examples, the second optical system projects a spot size of about 240×220 $\mu m^2$ at the sample surface. In some examples, sweeping the laser light source across a surface of a parabolic mirror provides an angular range of about 150 to about 65°. In some examples, the 2θ scatterometer is incorporated into a roll-to-roll manufacturing tool. In some examples, the method can further comprise recording a plurality of signals from the optical detector and averaging the plurality of signals.

According to examples of the present disclosure, a system for 2θ scatterometry is provided. The system can comprise a laser light source configured to provide a laser beam; one or more control optics configured to collimate and polarize of the laser beam; a first optical system configured to project a focal spot of the laser beam onto a first surface of a sample with a dynamically variable angle of incidence; a second optical system configured to collect reflected light from the sample and project collected reflected light onto an optical detector; and a digital oscilloscope configured to average and record a signal from the optical detector.

In some examples, the system can further comprise a galvanometer; and a mirror mounted on the galvanometer configured to sweep the focal spot of the laser light across the first surface of the sample. In some examples, the first optical system reduces a spot size of the laser beam to about 240×220 $\mu m^2$ at the sample surface. In some examples, the galvanometer provides a sinusoidal oscillation of about 2 kHz or more and a scan duration of about 0.25 ms/scan or less.

In some examples, the sample contains an patterned array of structures. For a pattern with symmetry in one-dimension pattern (e.g. a grating), the angular sweep can be in a direction parallel or perpendicular to the grating lines. For some cases, additional information is available for other directions of rotation, for example at 45° to the grating lines. For a pattern with symmetry in two-dimensions, the angular sweep can be in directions parallel to one or the other of the symmetry axes. In some cases, additional information is available for other directions of rotation.

BRIEF DESCRIPTION OF THE DRAWINGS

The accompanying drawings, which are incorporated in and constitute a part of this specification, illustrate embodiments of the present teachings and together with the description, serve to explain the principles of the disclosure.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
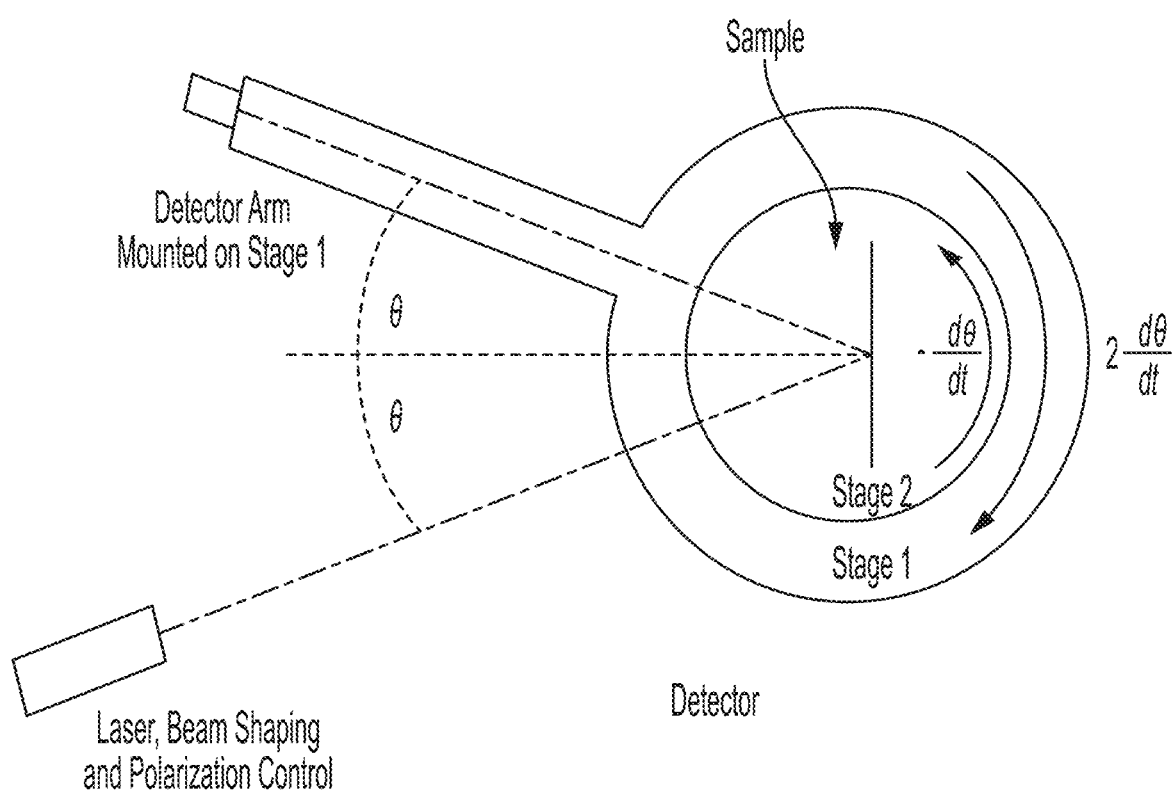
FIG. 1 shows a conventional 2θ-scatterometer apparatus including two concentric rotation stages.

FIG. 1 shows a conventional 2θ-scatterometer apparatus including two concentric rotation stages. This tool requires: 1) mounting a small piece of the sample with the measurement surface on the common rotation axis of the two stages; and 2) coordinated rotation of the stages to vary the angle of incidence while maintaining the reflected beam on the detector. Measurement time including signal averaging is several minutes, which is suitable for off-line measurements but is clearly too long for an in-line roll-to-roll tool that has to operate on time scales commensurate with the web speed. The scatterometry set-up demonstrated in FIG. 1 involves two computer-controlled rotation stages. See foe example, R. Zhu, S. R. J. Brueck, N. Dawson, T. Busani, P. Joseph, S. Singhal and S. V. Sreenivasan, *Scatterometry for Nanoimprint Lithography*, J. Vac. Sci. Technol. B34, 06K503 (2016).

The silicon industry is dominated by wafer-scale processing where stand-alone metrology tools are commonly used, and metrology measurements are not necessarily correlated with the manufacturing cycle. Increasingly, there is interest in migrating micron and sub-micron scale manufacturing to roll-to-roll (R2R) processes that offer throughput advantages. For R2R manufacturing, the inclusion of metrology that can operate at speed commensurate with the manufacturing process would be beneficial. Accordingly, aspects of the present disclosure provide for a 2θ-scatterometer apparatus and a method of operating the 2θ-scatterometer apparatus to monitor structures on a sample is provided that allows an optical beam to be moved while the sample stage is stationary (on the time-scale of the measurement). In some examples, the sample can include a R2R web.

As a rough estimate, typical R2R speeds for high resolution patterning are 10 cm/s. For a spot size diameter of ~300 μm, this allows a measurement time of $3\times10^{-3}$ sec before the measurement spot moves to a completely new area.

The present 2θ-scatterometer apparatus allows for optical beam scanning without interference with a sample support surface or movement of the sample by the support surface. The general concept of the present disclosure is: to focus a polarized laser beam with a optical system characterized by a first numerical aperture ($NA_1$) onto a galvanometer mirror; to rotate the galvanometer mirror across a second $\sin^{-1}(NA_2)$ angular range, $\sin^{-1}(NA_2) = \sin^{-1}(NA_2)|_{max} - \sin^{-1}(NA_2)|_{min}$ where $\sin(NA_2) > \sin(NA_1)$; to image the galvanometer mirror focal spot with $NA_2$ optics onto a conjugate image at the sample surface; and to relay the image further onto a detector with $NA_2$ optics, wherein the detector surface is also a conjugate image of the galvanometer mirror first surface and the surface of the sample. The $NA_2$ optics can constitute spherical lenses, spherical mirrors or paraboloidal mirrors.

Scatterometry measures the reflectivity from a planar sample which may contain a periodic array of micro- to nano-scale structures. The periodic array can be one-dimensional or two dimensional in the plane of the sample, and can have structure in the direction perpendicular to the surface (for a one-dimensional array, the structure could be a simple line with a width and a height above the surface, e.g. a grating, and the perpendicular structure could be the height of the lines). More complex perpendicular structures such as a layered structure, or a structure for which the line:space ratio changes with height are often encountered in manufacturing. Metrology is required to monitor the variations in these structure characteristics as the manufacturing process proceeds.

For periodicities smaller than λ/2, there are no propagating diffracted orders other than the zero-order reflected beam when a light is incident on the sample. However, a reflectivity vs. angle measurement provides information on the details of the structure.

There are several parameters of the measurement that can be varied to provide information on the sample. These include: 1) the polarization of the incident light. Most often for 2θ scatterometry linearly polarized light is used, polarized either in the plane of incidence (TM polarization) or perpendicular to the plane of incidence (TE polarization). The plane of incidence is the plane formed by the normal to the sample and the direction of the incident beam. In certain cases, circular polarization may provide additional information. Thus, it is necessary to build polarization flexibility into the measurement system to allow optimization for different samples.

For a one-dimensional array, the array wavevector (a vector in the plane of the sample perpendicular to the lines of the array) can be at any angle φ relative to the plane of incidence. For most familiar grating applications, φ=0°. If φ≠0°, the geometry is known as a conical diffraction geometry. Most often in 2θ scatterometry reflectance curves are measured for φ=0° and for φ=90°; but other angles can be investigated and may contain additional information for some samples.

For a two-dimension array, there are two (or more depending on the complexity of the unit cell) array wavevectors. Measurement protocols will be specific for different sample arrays. As always, there is an engineering trade-off between simplicity of design and flexibility of experimental configuration. For most samples, it is sufficient to consider linear polarization (TE or TM) and φ=0° or 90°.

Figure 2:
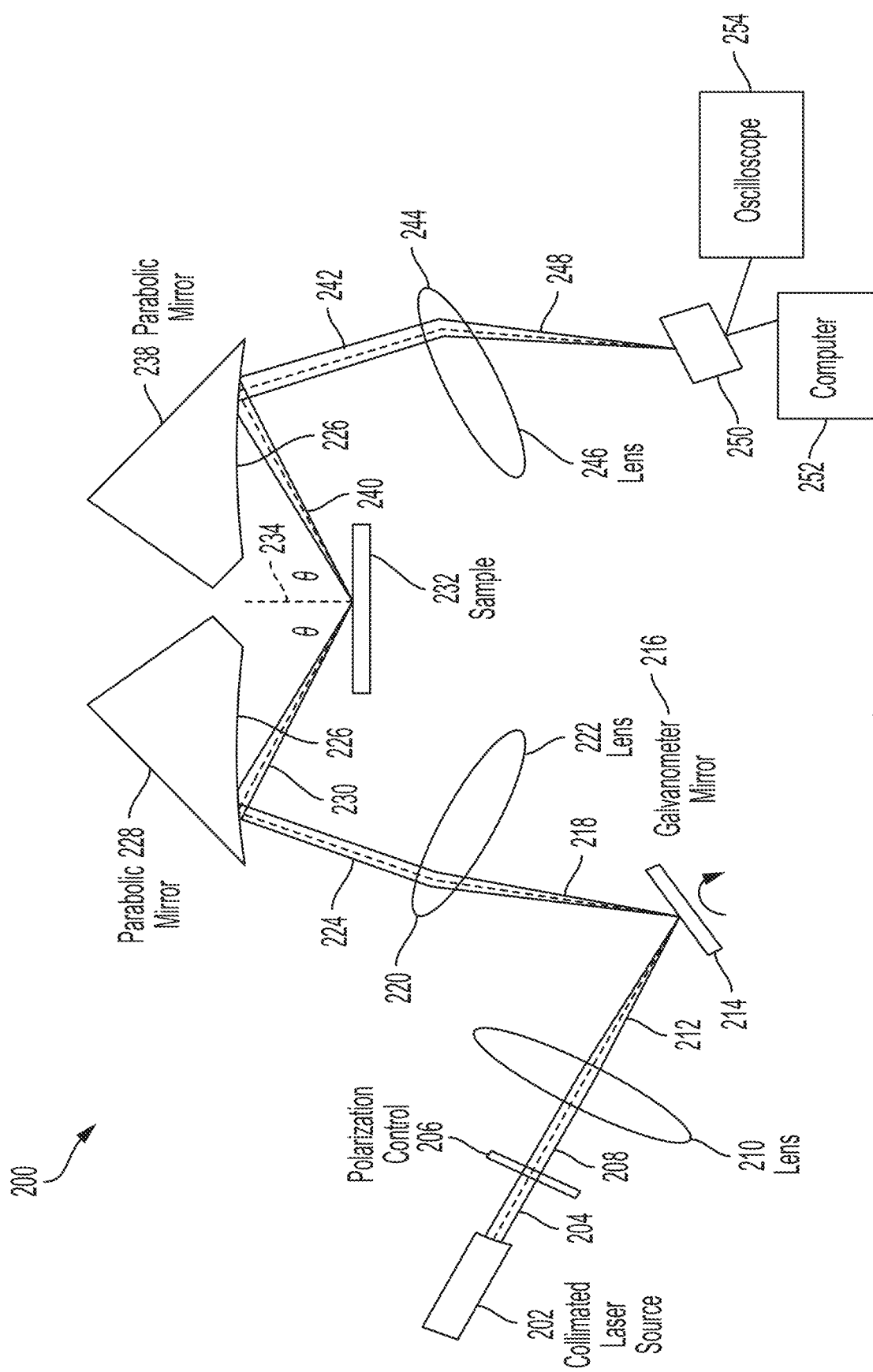
FIG. 2 shows a first 2D design in-line optical scatterometry set up according to examples of the present disclosure.

FIG. 2 shows a first in-line optical scatterometry system 200 according to examples of the present disclosure. A collimated laser source at a fixed wavelength (λ) 202 produces an optical beam 204, which is directed to a polarization control element 206 that transmits the optical beam 208 with a controlled polarization. In an embodiment, the first optical beam can have a collimated spot size of about 4 mm². A first lens 210 focuses the optical beam 212 onto a surface 214 of a first-surface galvanometer mirror 216. The galvanometer mirror 216 is configured to actuate through a range of angles to reflect the optical beam 218 with a direction that changes with the rotation of the galvanometer mirror over a range of directions that span across an entrance surface 220 of a second lens 222. The second lens 222 approximately collimates and transmits the optical beam 224 that is directed to a first reflecting surface 226 of a first parabolic mirror 228. The first reflecting surface of the paraboloidal mirror 226 reflects the beam 224 to produce an optical beam 230 that is incident on a first surface 234 of a sample 232 at a target location 234. In some examples, by using the combination of the first lens 210, the second lens 222, and the first parabolic mirror 228, the optical beam 230 can have a dimension of about 240×115 μm² at the target location 234 in the center of the angular scan. This spot size will vary across the angular range since the distance from the parabolic mirror to the sample varies with the angle of incidence. For 2θ scatterometry, the reflectance is independent of the spot size as long as the spot is much larger than the array period. The target location, which can be a surface of a R2R web, is optically conjugate to the front surface of the galvanometer mirror. As the galvanometer mirror 216 rotates, the optical beam 224 is swept across the first reflecting surface 226, which images the target location 234 with a time-varying angle of incidence. In an embodiment, the angular range produced by the galvanometer mirror 216 can be between about 20° to about 85°. A front reflecting surface 236 of a second parabolic mirror 238 receives the optical beam reflected from the sample surface 230 at position 234 as optical beam 240. For specular reflection from a planar surface, the angle of incidence of the incident beam relative to a normal to the surface is equal to the angle of reflection (both indicated by θ in the figure). The second parabolic first surface mirror 238 reflects and collimates the optical beam 240 as optical beam 242 to an entrance surface 244 of a third lens 246. The third lens 246 focuses the optical beam 242 as optical beam 248 to a detector 250. The second parabolic mirror 238 and the third lens 246 are arranged such that the optical beam 248 remains focused at the detector 250 during the scanning operation. The arrangement of FIG. 2 is such that a detection surface of the detector 250 is conjugate to the focal point of the laser source beam onto the galvanometer mirror 216. The detector 250 can be coupled with a signal processing electronics 254 to process a signal detected by the detector 250 to perform a measurement process to measure the angular dependence of the light reflected from target location 234. For example, for a sinusoidal galvanometer oscillation at 2.0 kHz, a scan duration of about ~0.25 ms is recorded (at 2.0 kHz the cycle repeats every 0.5 ms, but a cycle includes both a trace and a retrace) with the signal processing electronics 254, which can provide a reduction in the time for scatterometry signal acquisition as compared with the prior art. The signal processing electronics can receive and process several scans, which can be averaged as necessary for improved signal to noise. The goal is to have the measurement time comparable to the transit time of the web across the spot on the sample surface. Typical web scan speeds are up to 10 cm/s. Thus, the time for the web to move across a ~300 μm diameter spot is ~3 ms, at a scan speed of 2 kHz, the time necessary for a scan is 250 μsec [½ of the (repetition rate)$^{-1}$] which allows a comfortable margin for averaging multiple scans to improve signal-to-noise. Higher scan speeds are available as needed.

Scatterometry measures the reflection from a periodic structure. Unlike microscopy, this is an ensemble measurement that does not measure specific individual features, but measures the reflectivity from a group of features and uses an inverse modeling approach to deduce the feature dimensions and structure. For a manufacturing application, where the range of feature dimensions likely to be encountered is bounded, a simple approach to the fitting is to pre-calculate the forward problem (scattering intensity vs. angle) for a range of acceptable feature sizes and structure shapes and then evaluate the measured spectrum by a rapid least squares fitting to the pre-calculated angular spectra. This procedure can be configured to provide an alarm if the measured spectra deviate from an acceptable variation. A potential issues with scatterometry system 200 is that the optics extend below the sample surface. For a small test sample, this is not an issue. However, for integration with a R2R manufacturing system, the path of the web might interfere with the optical path as shown.

FIG. 3A shows a second in-line optical scatterometry system 300 according to examples of the present disclosure. FIG. 3B shows a perspective view of a portion of the optical set-up of FIG. 3A showing the mirror arrangement near the parabolic mirror. This system is designed to avoid the optical path issues discussed in conjunction with system 200. The system 300 is configured to measure a planar device 302. The system 300 comprises a first optical component 304 that is configured to produce an optical beam 306. For example, the first optical component 304 comprises the output of a laser 308 with appropriate optical components to result in a collimated beam. The diameter of the collimated beam may be ~2 mm. The system 300 further comprises a second optical component 309 that is configured to receive the optical beam 306 and produce a first conditioned optical beam 310. For example, the second optical component 309 comprises one or more optical elements configured to polarize and focus the optical beam produced by the first optical component 304 onto a front surface of moving mirror 316 via mirror 311. For example, the first conditioned optical beam 310 can have a beam profile having dimensions of about ~0.14 mm$^2$ at the front surface of the moving mirror 316. The NA$_1$ at the moving mirror 316 can be about 0.004. The moving mirror 316 is configured to receive the first conditioned optical beam 310 and sweep the first conditioned optical beam 310 across range of angles commensurate with the numerical aperture NA$_2$ of the following optical components. For example, the movable mirror 316 is configured to move at a frequency of about 2 kHz, which results in a scanning time of about 0.25 msec/half-scan. For example, the moveable mirror 316 can be a galvanometer mirror that includes mechanical and electrical resonance structures designed for a specific frequency. For example, if the sample is a web that is moved during the measurement process, the frequency at which the movable mirror 316 is moved can be varied based on a speed at which the web is moved. For a web movement speed of 10 cm/sec, the overall measurement process can be about 5 msec.

The system 300 further comprises additional optical components that are configured to receive the conditioned optical beam 310 from the movable mirror 316 and direct the conditioned optical beam 310. For example, the additional optical components comprises collimating lens 320, a trio of flat mirrors 322, 324 and 326 and a first parabolic mirror 332 that is configured to receive the conditioned optical beam 310 from the movable mirror 316 and direct the conditioned optical beam 310 to a focus conjugate with the focus at the movable mirror 316, i.e., galvanometer mirror, at target area 338 of the planar device 302. The flat mirror 326 allows for the conditioned optical beam 310 to be directed from a side position of the target area 338 and avoids any interference between the optics and the web path. The first parabolic mirror 332 can be a 45° off-axis parabolic mirror that allows for a scanning range of about 50° for the conditioned optical beam 310 at the target area 338 (e.g. this is an off-axis optical system with θ ranging from 15° to 65° or NA$_{2min}$=0.26 and NA$_{2max}$=0.906). This range can be adjusted by variation of the optical system, for example the range can be adjusted to 30° to 80° (NA$_{2min}$=0.5 and NA$_{2max}$=0.985). A higher scanning range is available with different parabolic mirrors. The system 300 further comprises a collection optical system that is configured to receive a reflected optical beam 340 from the target area 338. For example, the collection optical system comprises a second parabolic mirror 344, flat mirrors 354, 355 and 356, and focusing lens 358.

For example, the movable mirror 316 is configured to sweep the first conditioned optical beam 310 across a surface of the first parabolic mirror 332 to scan the focal spot across the semiconductor device 302 with a time-varying angle of incidence. The first conditioned optical beam 310 can be swept across the surface of the first parabolic mirror 332 over an angular range of about 30° to about 65°.

The system 300 further comprises a detector 362 that is configured to receive the conditioned scattered optical beam 360 that is used to measure a feature of the target area 338. As in the previous system of FIG. 2, the front surface of the movable mirror 316, the sample area 338 and the detector 362 are optically conjugate surfaces that are invariant as the angle is scanned. The total volume occupied by the various optical components of the system 300 can be about ~0.12 m$^3$. The detector 362 can be in data communication with an oscilloscope 364 and signal processor of a computer 366 to process signals from the detector 362. For a sinusoidal galvanometer oscillation of the movable mirror 316 of 2 kHz, a scan duration of about 0.25 ms is recorded by the detector 362 and processed by the oscilloscope 364 and computer 366. The oscilloscope 362 can average several scans for improved signal-to-noise ratio.

Figure 4:
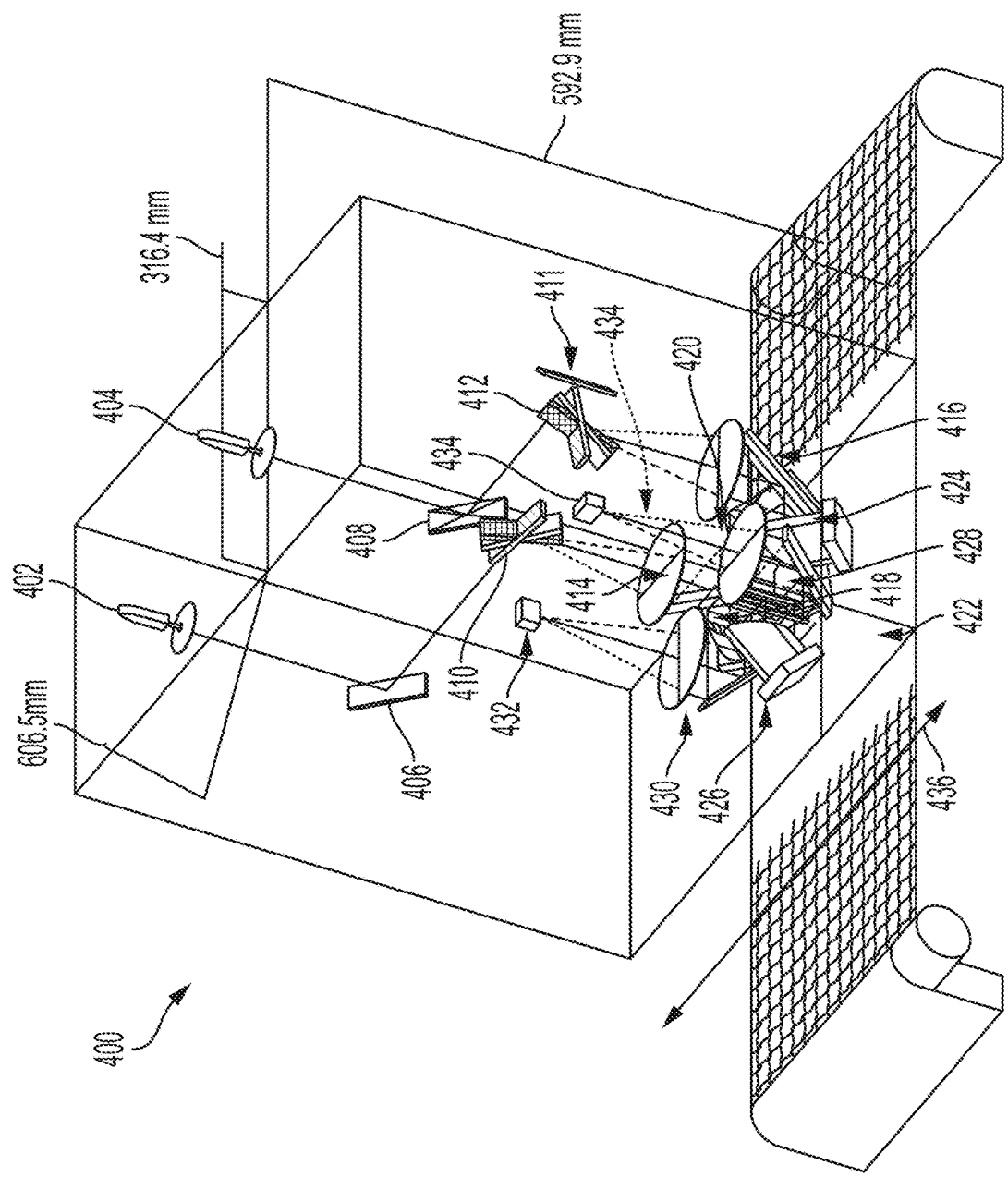
FIG. 4 shows a 3D design for an in-line optical scatterometry set up based on the second design of FIGS. 3A and 3B where one scatterometer is arranged along the web direction and one scatterometer is arranged across the web direction.

FIG. 4 shows a three dimensional (3D) view of system 400 that is similar to the system of 300. FIG. 4 also show relevant dimensions between various optical components of system 400. In FIG. 4, two scatterometry systems operating in orthogonal directions are shown to provide additional metrology information. In FIG. 4, two lasers are shown that can operate simultaneously or in sequence to perform different measurements of a sample surface. Optical beams produced by a first laser 402 and a second laser 404 are directed to a first mirror 406 and a second mirror 408, respectively. Optical beams reflected by the first mirror 406 and the second mirror 408 are directed to a first movable mirror 410 and a second moveable mirror 412, respectively. In the case of the optical beam reflected by the second mirror 408, a third mirror 411 is also used. Optical beams reflected by the first movable mirror 410 and the second movable mirror 412 are directed to a set of three (3) flat mirrors 414 and a set of three flat mirror 416, respectively. Optical beams reflected the flat mirrors 414 and the flat mirrors 416 are directed to first parabolic mirrors 418 and second parabolic mirrors 420. Scattered optical beams from the sample surface 422 are reflected by a third parabolic mirror 424 and a fourth parabolic mirror 426 and directed to a set of three flat mirror 428 and a second set of three flat mirror 430, respectively. Optical beams reflected from flat mirrors 428 and the flat mirrors 430 are directed to detector 432 and detector 434. The distance between the first laser 402 and the second laser 404 and the sample surface 422 (height of the system 400) can be about ~600 mm. The width of the system 400 can be about ~320 mm. The depth of the system 400 can be about ~610 mm. The entire system can be translated perpendicularly to the web direction, as indicated by arrow 436, to provide information on structures at various positions across the web with a total system 400 volume of ~0.12 $m^3$.

System 400 can be configured to move side to side in the direction perpendicular to the web motion to provide information on the performance of the roll-to-roll system across the web.

Figure 3:
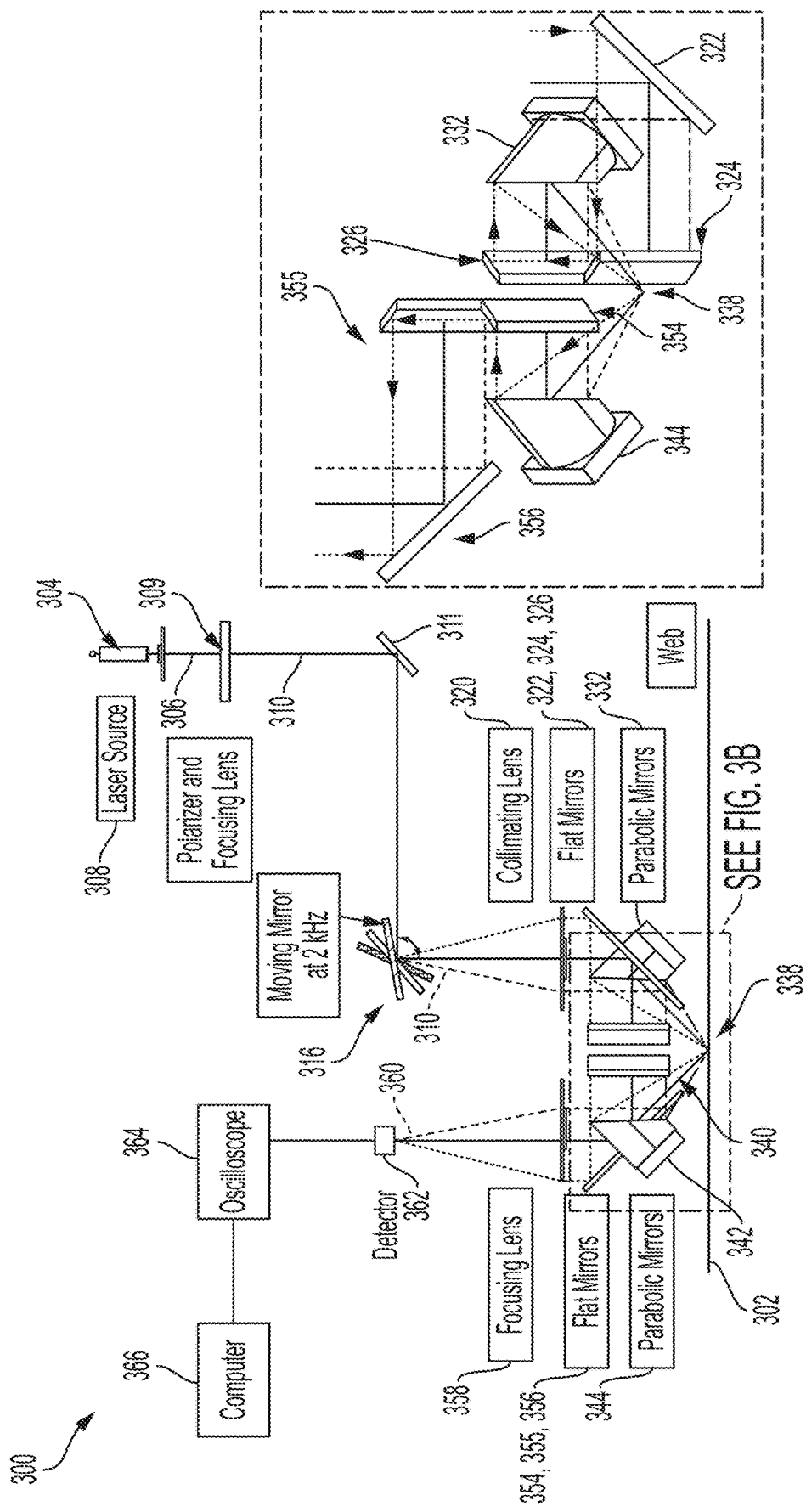
FIG. 3A shows a second 2D design in-line optical scatterometry set up according to examples of the present disclosure.
FIG. 3B shows a perspective view of a portion of the optical set-up of FIG. 3A showing the mirror arrangement near the parabolic mirrors.
Figure 5:
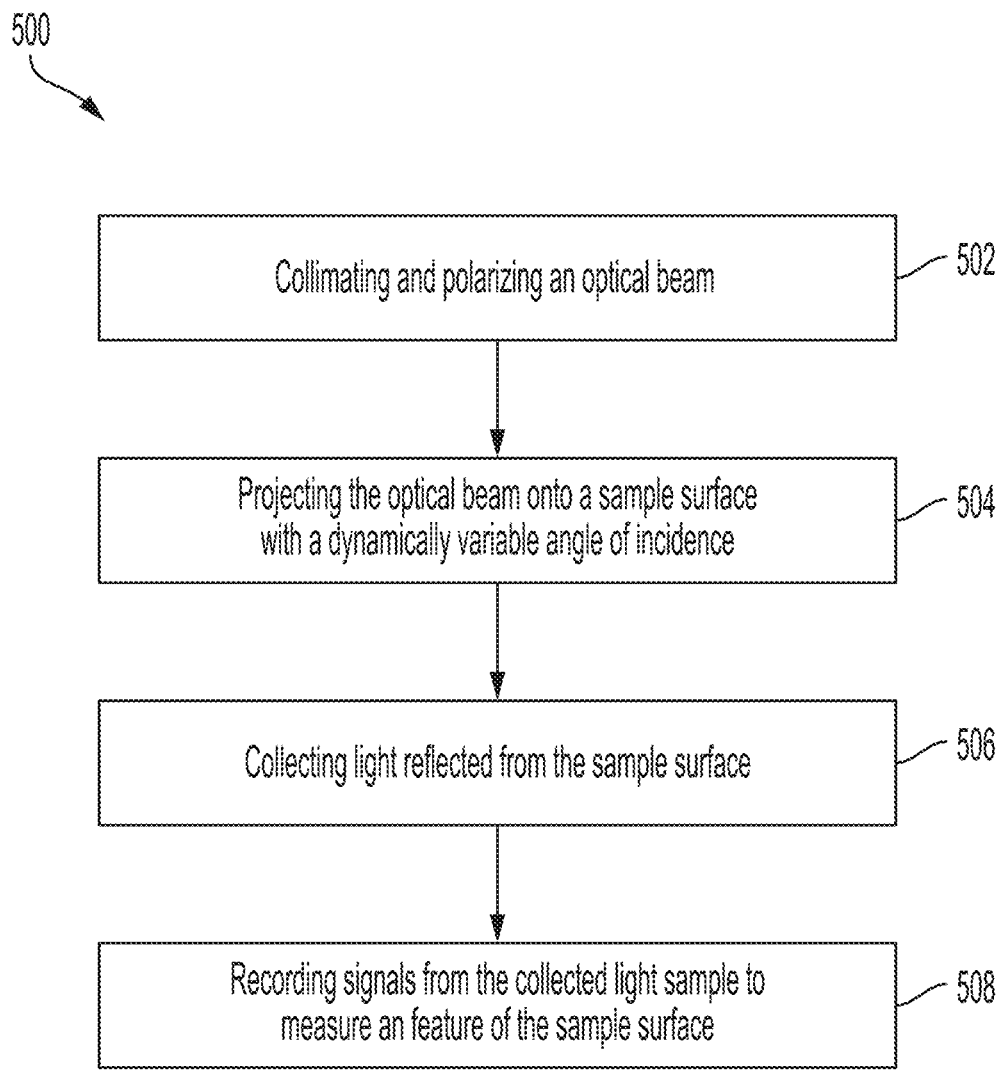
FIG. 5 shows a method for measuring a feature of a sample using a 2D design in-line optical scatterometry of FIG. 2 or FIGS. 3A and 3B according to examples of the present disclosure.

FIG. 5 show a method 500 for measuring an angular spectrum from a periodic array of structures and uses an inverse fitting process to deduce the feature dimensions. The optical system is configured as shown in FIGS. 2 and 3A and 3B. The method 500 begins by collimating and polarizing, at 502, using a first optical system, an optical beam from a laser light source to produce a collimated and polarized optical beam. For example, with regard to FIG. 2, the collimated laser source 202 produces the first optical beam 204 that is polarized by the polarized element 206 and focused by the first lens 210. For example, with regard to FIG. 3, the optical beam 306 produced by the laser 308 is conditioned by the second optical component 309 by polarizing and focusing the optical beam 306.

The method 500 continues by projecting, at 504, using a second optical system, a focal spot of the collimated and polarized optical beam onto a sample surface with a dynamically variable angle of incidence. For example, with regard to FIG. 2, the galvanometer mirror 216, the second lens 222, and the first parabolic mirror 228 are used to direct the optical beam 230 to the target location 234. For example, with regard to FIG. 3, the conditioned optical beam 310 is swept through a range of angles by the movable mirror 316, which is then received by the additional optical components, e.g., collimating lens 320, flat mirrors 322, 324, 326, and the first parabolic mirror 332 332 to be directed onto the planar sample 302 at a target area 338.

The method 500 continues by collecting, at 506, by additional optical components, light reflected from the sample at an optical detector. For example, with regard to FIG. 2, the second parabolic mirror 238 and the third lens 246 receive a reflected optical beam from the target location 234 and direct the eighth optical beam to the detector 250. For example, with regard to FIG. 3, the flat mirrors 354, 355, 356 and the focusing lens 358 collect and focus the scattered optical beam 360 from the target area 338.

The method 500 continues by recording, at 508, a signal from the optical detector. For example, with regard to FIG. 2, the detector 250 receives the optical beam 248 and provides one or more signals indicative of the intensity of optical beam 248 as a function of the polarization and the angle of incidence to the computer 252 and/or the digital oscilloscope 254 for processing to measure a characteristic features of the sample 232 at the target location 234. For example, with regard to FIG. 3, the detector 362 receives optical beam 360 from the second parabolic mirror 344, the flat mirrors 354, 355, 356, and the focusing lens 358. The detector 362 can be in data communication with the oscilloscope 364 and/or the computer 366. The computer 366 averages multiple scans and performs a data fitting operation to measure a feature of the target area 338.

For example, the computer 252 or computer 366 can configured to perform operations described in Zhu, A. Munoz, S. R. J. Brueck, S. Singhal, S. V. Sreenivasan, *Metrology of a 50-nm HP wire-grid polarizer: a SEM-scatterometry comparison*, Proc. SPIE 9424, 94241 W (2015) and R. Zhu, S. R. J. Brueck, N. Dawson, T. Busani, P. Joseph, S. Singhal and S. V. Sreenivasan, *Scatterometry for Nanoimprint Lithography*, J. Vac. Sci. Tech. B34, 06K503 (2016). Several simulation techniques can be used for the forward analysis (computing the reflectivity vs. angle for the given polarization and conical diffraction conditions for a fixed structure). One embodiment uses rigorous coupled wave analysis (RCWA); finite difference time domain (FDTD) approaches are another embodiment, finite element analysis (FE) is a third embodiment.

In one example, a rigorous coupled-wave analysis with a simulation model of a periodic array of Al lines on top of a fused silica substrate is used by the computer 252 or the computer 366. From SEM results the etching of the Al lines extended slightly into the silica substrate so an additional parameter, the depth of a $SiO_2$, etch is added to the model. The grating profile is defined by seven parameters: pitch (P), bottom linewidth (LW), top linewidth (TW), Al thickness (Al), fused silica undercut (FS), horizontal (HR) and vertical extent (VR) of the top rounding. The refractive indices of Al and $SiO_2$ are taken from the literature. For the analysis, each term of the seven parameter is individually varied, while other terms are held constant. A starting point for the analysis is chosen to be a reasonable starting guess for each of the seven parameters by considering a cross section of a SEM image of the sample. Using this analysis of the simulation results, wavelengths including 244 nm, 405 nm and 633 nm have enough capability and sensitivity to resolve 100-nm periodic structures.

Figure 6:
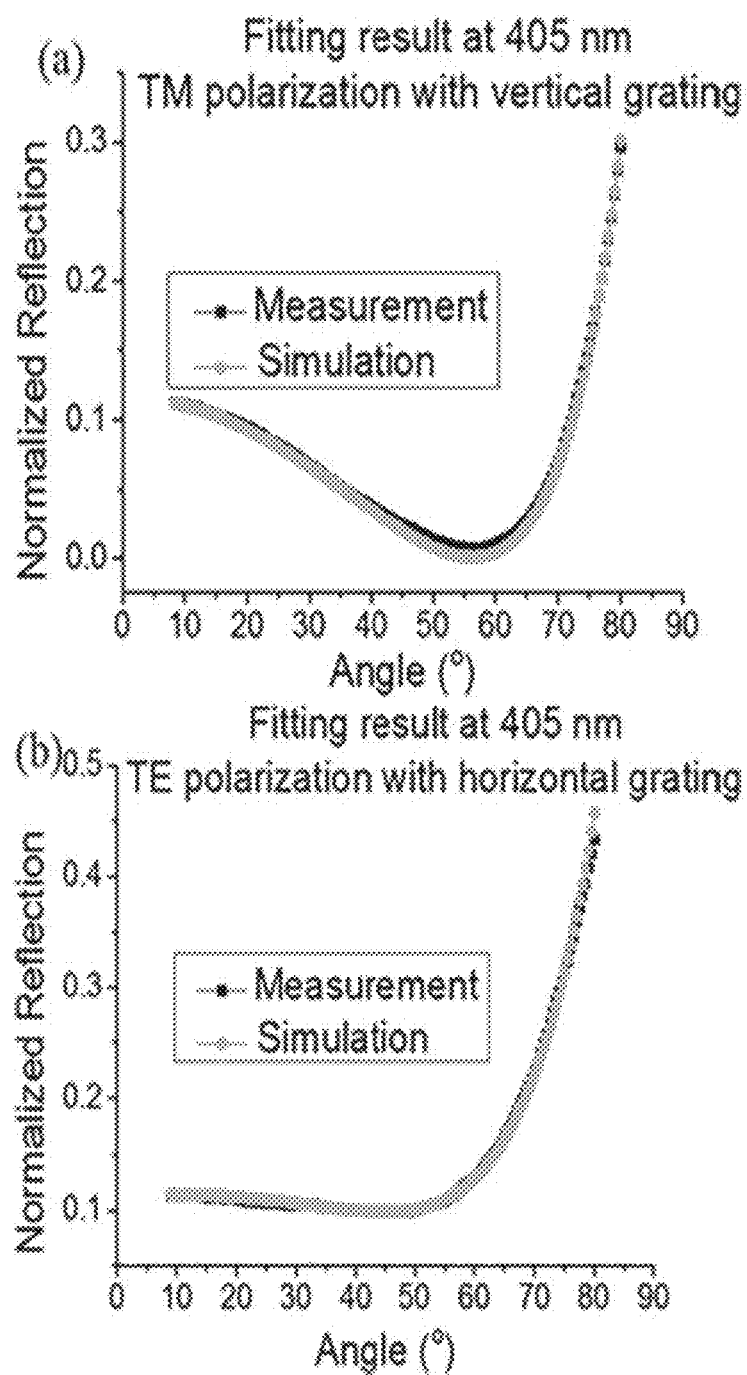
FIG. 6 shows a fitting result for a wire-grid polarizer using a 405 nm laser source. The fitted parameters of the Al grating lines are: pitch of 97.2 nm, bottom linewidth (at substrate) of 49.4 nm; top width (before rounding) of 58.6 nm; aluminum height of 208.3 nm; undercut into fused silica of 22.9 nm; horizontal rounding of 25.8 nm; vertical rounding of 14.8 nm and $Al_2O_3$ overcoat of 4 nm. The apparatus of FIG. 1 was used to obtain this measurement.

FIG. 6 shows an example for a wire grid polarizer structure (a nominally 100-nm pitch one-dimensional Al grating structure on a fused silica substrate. FIG. 6 is taken from FIG. 11 of Zhu et al. The manufacturing process includes depositing a blanket Al film of nominally 200 nm thickness, nanoimprint lithography to define the grating structure, reactive-ion etching to remove the Al between the grating lines, which results is some rounding of the top of the lines as well as a taper of the linewidth from top to bottom. As a result of the etching process there is a small undercut into the fused silica substrate. Additionally an Al oxide overcoat on the Al forms on exposure to air. Thus, there are eight parameters that define even this straightforward manufacturing process: 1) the period of the grating, P; 2) the bottom Al linewidth (at the fused silica interface), BW; 3) the top Al linewidth (before the rounding), TW; 4) the thickness of the Al line, H; 5) the horizontal rounding (HR); 6) the vertical rounding, VR; 7) the undercut into the fused silica, SIO; and 8) the AlO thickness, ALO. Two experimental geometries were measured with the apparatus of FIG. 1. A) TE polarization with the grating lines perpendicular to the axis of polarization, and B) TM polarization with the grating lines parallel to the axis of rotation. As can be seen in FIG. 6, there is excellent agreement between the measured and simulated angular reflectivities for the parameters: P=97.2 nm; BW=49.4 nm; TW=58.6 nm; H=208.3 nm; HR=25.8 nm; VR=14.8 nm; SIO=22.9 nm; and ALO=4 nm.

The computer 252 or the computer 366 can be implemented with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but, in the alternative, the processor can be any conventional processor, controller, microcontroller, or state machine. A processor can also be implemented as a combination of computing devices, e.g., a combination of a DSP and/or GPU and a microprocessor, a plurality of microprocessors, one or more microprocessors in conjunction with a DSP core and/or GPU core, or any other such configuration.

In one or more exemplary embodiments, the functions described can be implemented in hardware, software, firmware, or any combination thereof. For a software implementation, the techniques described herein can be implemented with modules (e.g., procedures, functions, subprograms, programs, routines, subroutines, modules, software packages, classes, and so on) that perform the functions described herein. A module can be coupled to another module or a hardware circuit by passing and/or receiving information, data, arguments, parameters, or memory contents. Information, arguments, parameters, data, or the like can be passed, forwarded, or transmitted using any suitable means including memory sharing, message passing, token passing, network transmission, and the like. The software codes can be stored in memory units and executed by processors. The memory unit can be implemented within the processor or external to the processor, in which case it can be communicatively coupled to the processor via various means as is known in the art.

Notwithstanding that the numerical ranges and parameters setting forth the broad scope of the embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

The following embodiments are described for illustrative purposes only with reference to the Figures. Those of skill in the art will appreciate that the following description is exemplary in nature, and that various modifications to the parameters set forth herein could be made without departing from the scope of the present embodiments. It is intended that the specification and examples be considered as examples only. The various embodiments are not necessarily mutually exclusive, as some embodiments can be combined with one or more other embodiments to form new embodiments.

While the embodiments have been illustrated respect to one or more implementations, alterations and/or modifications can be made to the illustrated examples without departing from the spirit and scope of the appended claims. In addition, while a particular feature of the embodiments may have been disclosed with respect to only one of several implementations, such feature may be combined with one or more other features of the other implementations as may be desired and advantageous for any given or particular function.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of A, B and C.

Other embodiments will be apparent to those skilled in the art from consideration of the specification and practice of the descriptions disclosed herein. It is intended that the specification and examples be considered as exemplary only, with a true scope and spirit of the embodiments being indicated by the following claims.

What is claimed is:

1. A system for measuring a periodic array of structures on a sample, comprising:
    an optical source configured to produce an optical beam;
    an optical system configured to control the polarization of the optical beam and to focus the optical beam with a first $NA_1$ on a sample surface and to sweep the angle of incidence across a range of angles with an approximately fixed focal position on a sample surface with a second $NA_2$ wherein $NA_2 > NA_1$;
    additional optical components configured to receive the optical beam reflected from the sample surface and to focus the reflected beam onto a detector; and
    a recording system to record the reflectivity of the sample surface as a function of the angle of incidence.

2. The system of claim 1, wherein the optical source comprises a laser.

3. The system of claim 1, wherein the optical system comprises optical components that focus an incident laser source onto a rotating mirror and wherein the focal point on the rotating mirror is optically conjugate to a focal point on the sample and additionally is optically conjugate to a focal point on a detector used to record the reflectivity of the sample.

4. The system of claim 1, wherein at least one 2θ scatterometry apparatus is integrated into a roll-to-roll manufacturing tool.

5. The system of claim 4, wherein the output of the 2θ scatterometry measurement is used to provide a metrology module for assessing the performance of the manufacturing tool.

6. The system of claim 3, wherein the optical components include a parabolic mirror.

7. The system of claim 3, wherein a linear dimension of the focal spot on the sample is approximately 200 µm.

8. The system of claim 3, wherein the optical components include a parabolic mirror.

9. A method for 2θ scatterometry comprising:
collimating and polarizing, using optical components, an optical beam from a laser light source to produce a collimated and polarized optical beam;
sweeping the collimated and polarized optical beam across a surface of a parabolic mirror resulting a focal spot on a sample with a sweep of an angle of incidence of ranging from about 15° to about 65°;
collecting, by a third optical system, light reflected from the sample at an optical detector;
recording a signal from the optical detector giving the reflectivity vs. angle of incidence of the sample; and
interpreting the recorded angular spectrum to monitor the status of the sample.

10. The method of claim 9, wherein the second optical system projects a spot size of about 240×220 µm² at the sample surface.

11. The method of claim 9, wherein the 2θ scatterometer is incorporated into a roll-to-roll manufacturing tool.

12. The method of claim 9, further comprising recording a plurality of signals from the optical detector and averaging the plurality of signals.

13. A system for 2θ scatterometry comprising:
a laser light source configured to provide a laser beam;
one or more control optics configured to collimate and polarize of the laser beam;
a first optical system configured to project a focal spot of the laser beam onto a first surface of a sample with a dynamically variable angle of incidence and at a scanning speed such that a duration of an angular scan is at least fast enough that the sample has not moved by more than a spot size of the laser beam on the sample during a scan;
a second optical system configured to collect reflected light from the sample and project collected reflected light onto an optical detector; and
a digital oscilloscope configured to average and record a signal from the optical detector.

14. The system of claim 13, further comprising:
a galvanometer; and
a mirror mounted on the galvanometer configured to sweep the focal spot of the laser light across the first surface of the sample.

15. The system of claim 13, wherein the first optical system reduces a spot size of the laser beam to about 240×220 µm² at the sample surface.

16. The system of claim 14, wherein the galvanometer provides a sinusoidal oscillation of about 2 kHz or more and a scan duration of about 0.25 ms/scan or less.

17. The system of claim 13, further comprising:
a movable mirror configured to sweep the focal spot of the laser light across the first surface of the sample.

18. The system of claim 17, wherein the moveable mirror is moved based on the web speed.

* * * * *